United States Patent
Lee et al.

(10) Patent No.: US 6,839,296 B2
(45) Date of Patent: Jan. 4, 2005

(54) CONTROL CLOCKS GENERATOR AND METHOD THEREOF FOR A HIGH SPEED SENSE AMPLIFIER

(75) Inventors: Yu-Wei Lee, Hsin-Chu (TW); Hsiao-Yang Hsu, Hsin-Chu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/458,260

(22) Filed: Jun. 11, 2003

(65) Prior Publication Data

US 2003/0231539 A1 Dec. 18, 2003

(30) Foreign Application Priority Data

Jun. 14, 2002 (TW) ........................................ 91113116 A

(51) Int. Cl.[7] ................................................. G11C 7/00
(52) U.S. Cl. ............................. 365/205; 327/56; 327/57
(58) Field of Search ................................. 365/205, 203, 365/207; 327/56, 57

(56) References Cited

U.S. PATENT DOCUMENTS

| | | | | |
|---|---|---|---|---|
| 5,783,949 A | * | 7/1998 | Reohr et al. ................. | 326/106 |
| 5,825,702 A | * | 10/1998 | Noda ........................... | 365/203 |
| 6,456,548 B2 | * | 9/2002 | Sudo et al. .................. | 365/207 |

* cited by examiner

Primary Examiner—Tan T. Nguyen
(74) Attorney, Agent, or Firm—Rabin & Berdo, P.C.

(57) ABSTRACT

A control clocks generator and method thereof for a high speed sense amplifier generates control clocks by utilizing RC delay and gate delay, in combination with reference sensing delay induced from a reference sense amplifier, and thereby, is tracking well for the high speed sense amplifier with process, temperature and voltage variations.

5 Claims, 6 Drawing Sheets

CONTROL CLOCKS GENERATOR AND METHOD THEREOF FOR A HIGH SPEED SENSE AMPLIFIER

FIELD OF THE INVENTION

The present invention relates generally to a control clocks generator, and more particularly, to a control clocks generator and method thereof for a high speed sense amplifier (SA).

BACKGROUND OF THE INVENTION

Sense amplifier is typically used to read out the state, e.g., "0" or "1", of the memory cell in a memory array, for example, ROM. A ROM array contains probably millions of memory cells arranged in rows and columns, each one of the memory cells in a column has a source that could be connected to a column source line, and during the sense amplifier is reading a selected memory cell, the column source line connected to the selected memory cell could be connected to a reference voltage or grounded. The drain of each one of the memory cells in a column is connected to an individual bit line, also known as column drain line, and during the sense amplifier is reading the selected memory cell, the column drain line connected to the selected memory cell is connected to the input of the sense amplifier. The control gate of each one of the memory cells in a row is connected to a word line, and the word line connected to the selected memory cell is connected to a predetermined voltage in the reading process.

During the reading operation, the current flowing through the selected memory cell is compared with a reference current to determine the selected memory cell is programmed with a "0" or a "1". The reference circuit is coupled to the input of a current sense amplifier whose output is coupled to one input of a differential amplifier. When reading the selected memory cell, the differential amplifier compares the output voltage of the sense amplifier with the output voltage of another current sense amplifier coupled to the selected memory cell. If the reference circuit comprises a memory cell that is substantially identical to the selected memory cell, then the balance of the current sense amplifier is usually necessary to be broke for a reference current to be between the current of the selected memory cell being programmed with "0" and the current of the selected memory cell being programmed with "1".

Precision control of the control clocks in timing is one of the fators for high speed operation in a sense amplifier. Unfortunately, due to the different process corners, temperature and voltage variations, the control clocks lack of well tracking capability and lead the sense amplifier difficult to be improved for the speed thereof. Referring to for example U.S. Pat. No. 5,771,196 issued to Yang, the control circuit consists of three blocks including the address transition pulse (ATP) generator, the precharge signal (PCB) generator and the latch signal (LATB) generator. The ATP signal is used as the trigger source of the control clocks, such as the precharge signal PCB, the latch signal LATB and the enable signal SAB of the sense amplifier. The precharge signal PCB should be the slower one of the word line delay and the bit line pull-up delay. For a flat ROM, the word line delay is much longer than the bit line pull-up delay, and thus, the word line delay is usually used to control the precharge signal PCB, and the width of the latch signal LATB should be larger than that of the precharge signal PCB. Further, the timing between the precharge signal PCB and latch signal LATB should be properly selected to latch correct data, and it is related to the sense time that is directly proportional to the memory cell current. The latch signal LATB is produced by adding a delay to the precharge signal PCB, in which the delay is controlled by the memory cell current from the mini-array, and the precharge signal PCB raises after several nanoseconds after the latch signal LATB to for correct data to be latched. In prior arts, the control signals are generated by referring to the memory cell current of the mini-array use in combination with RC (i.e., word line) delay and gate delay. Nevertheless, due to the different process corners, temperature and voltage variations, the control clocks lack of well tracking capability and as a result, it is difficult to improve the speed of the sense amplifier.

Therefore, it is desired a scheme to generate control clocks for high speed sense amplifier.

SUMMARY OF THE INVENTION

One object of the present invention is to provide a control clocks generator and method thereof for a high speed sense amplifier, by which control clocks are generated by use of the combination of RC delay, gate delay and reference sensing delay from the reference sense amplifier. As a result, it is obtained well tracking capability, regardless of process corners, temperature and voltage variations.

In a control clocks generator, according to the present invention, the address transition pulse signal is served as the trigger source to produce a precharge signal by a first RC delay and a latch signal by a combination of RC delay, gate delay and reference sensing delay induced from a reference sense amplifier, and the latch signal is further applied with a gate delay to produce a sense amplifier enable signal. In a prefered embodiment, the circuit to produce the latch signal includes three paths, among which the main path applies RC delay, gate delay and reference sensing delay to the address transition pulse signal, and the other two are used to add guard bands in front of and after the delay of the main path, respectively, for the latch signal to be located in a safe region. In particular, the second path applies RC delay and gate delay to the precharge signal such that the delay of the latch signal to the precharge signal is not over a maximum value, and the third path applies RC delay and gate delay to the address transition pulse such that the delay of the latch signal to the precharge signal is not smaller than a minimum value.

An improved sense amplifier is further provided to produce a sensing delay, which includes a reference data line to be coupled with the mini-array for memory cell current simulation. The improved sense amplifier separates the precharge path and sense path, and connectes the precharge path and sense path with a common gated MOS pair, respectively, so as to adjust the sensing delay by changing the size ratio of the MOS pair.

As a result, the inventive control clocks generator and method has a sensing delay very close to the actual sensing delay, and thus provides the high speed sense amplifier with well tracking capability, regardless of process corners, temperature and voltage variations.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
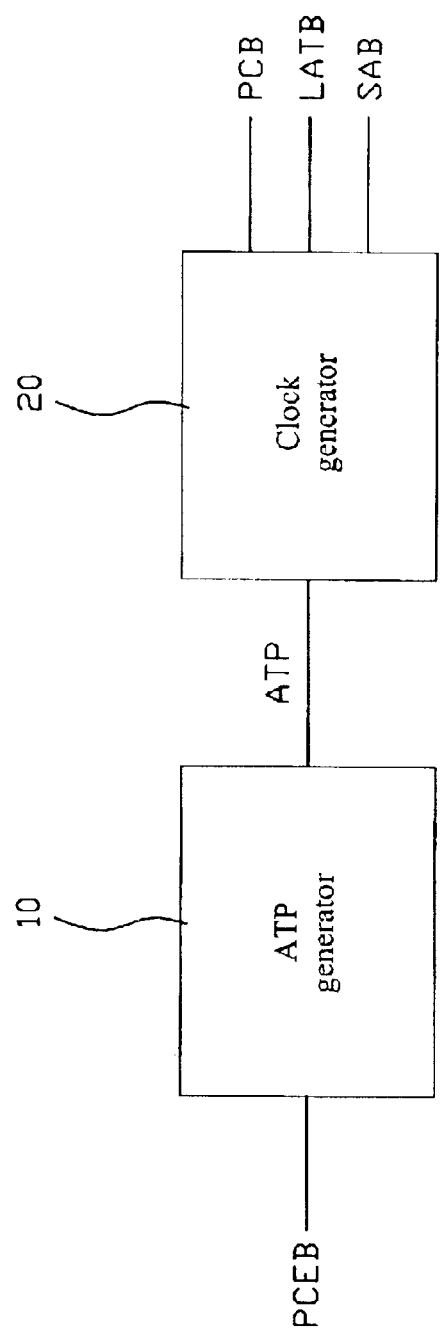
FIG. 1 shows a scheme to generate control signals PCB, LATB and SAB in a sense amplifier.

FIG. 1 is a block diagram to illustrate a scheme to generate control signals for a sense amplifier, in which an address transition pulse (ATP) generator 10 produces an address transition pulse signal ATP in response to a chip enable signal PCEB, and then a clock generator 20 produces three control signals from the ATP, including precharge signal PCB, latch signal LATB and sense amplifier enable signal SAB.

Figure 2:
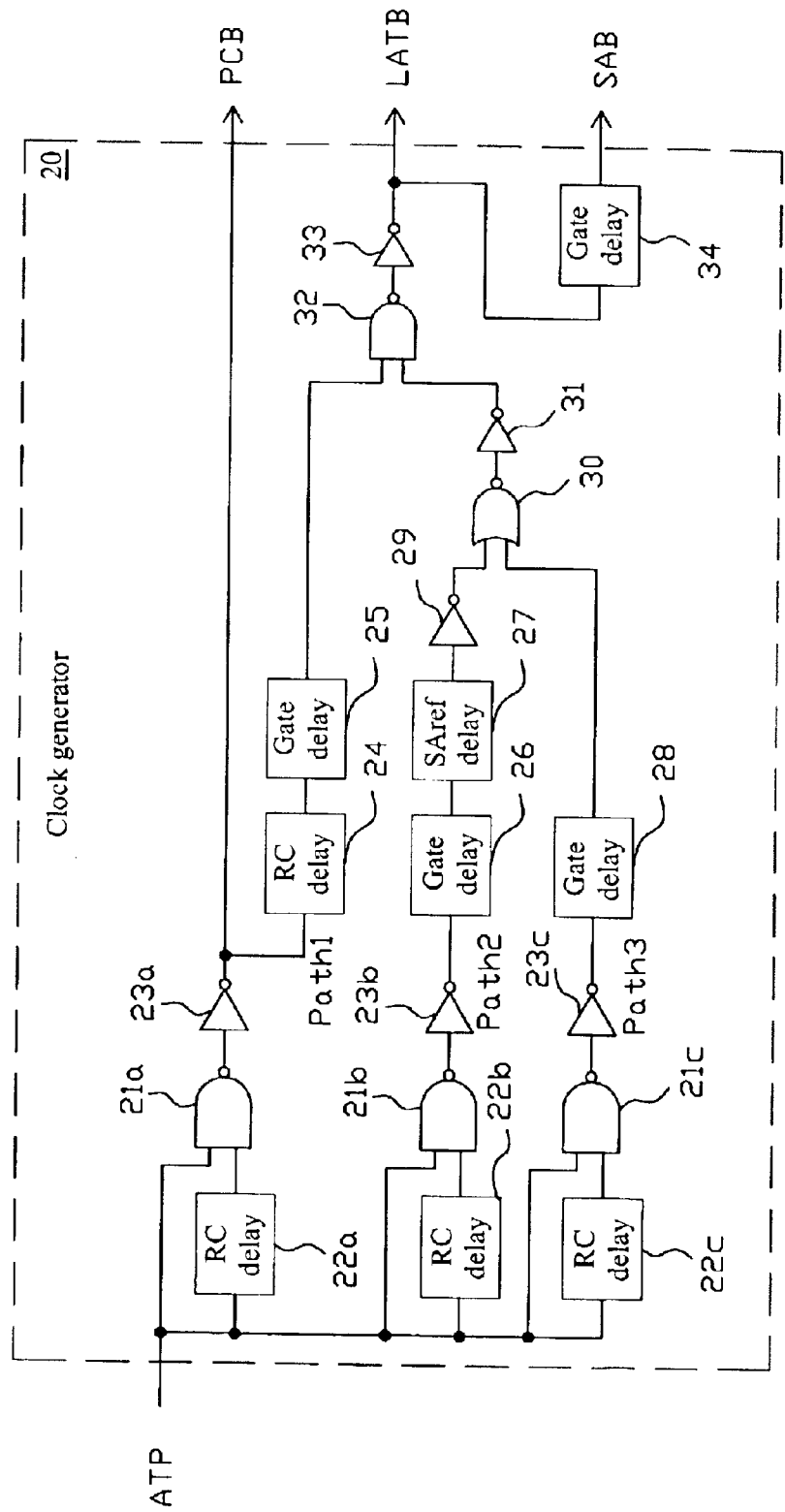
FIG. 2 is a prefered embodiment control clocks generator according to the present invention.

A prefered embodiment for the clock generator 20 is shown in FIG. 2, which uses the address transition pulse signal ATP as a trigger source to produce the required control clocks. In the clock generator 20, the two inputs of a NAND gate 21a are coupled with the address transition pulse signal ATP and its delayed signal through an RC delay 22a, respectively, and then the output of the NAND gate 21a passes through an inverter 23a to produce the precharge signal PCB. The circuit to produce the latch signal LATB is more complicated, which includes three paths, Path1, Path2 and Path3, and the delay thereof is dominantly determined by the Path2 to connect the address transition pulse signal ATP and its delayed signal from an RC delay 22b to a NAND gate 21b together with an inverter 23b, and to further apply a gate delay 26 and a reference sensing delay 27 to the output of the inverter 23b. On the other hand, the Path1 applies an RC delay 24 and gate delay 25 to the output of the inverter 23a, and the Path3 connects the address transition pulse signal ATP and its delayed signal from an RC delay 22c to a NAND gate 21c together with an inverter 23c and applies a gate delay 28 to the output of the inverter 23c. Then the delays produced by these three paths Path1, Path2 and Path3 are combined to determine the latch signal LATB. In detail, after through an inverter 29, the output of the reference sensing delay 27 is connected to a NOR gate 30 as well as is the output of the gate delay 28, and the output of the NOR gate 30 is further coupled to an inverter 31 to be gated together with the output of the gate delay 25 by a NAND gate 32 and an inverter 33 to produce the latch signal LATB. In the operation, the timing of the latch signal LATB is dominantly controlled by the Path2, and the other two, Path1 and Path3, add guard bands to the latch signal LATB, respectively, for the latch signal LATB to be in a safe region. In other words, the minimum delay of the latch signal LATB is controlled by the Path3, and the maximum delay is controlled by the Path1. The enable signal SAB for the sense amplifier is obtained by further applying a gate delay 34 to the output of the inverter 33.

Figure 3:
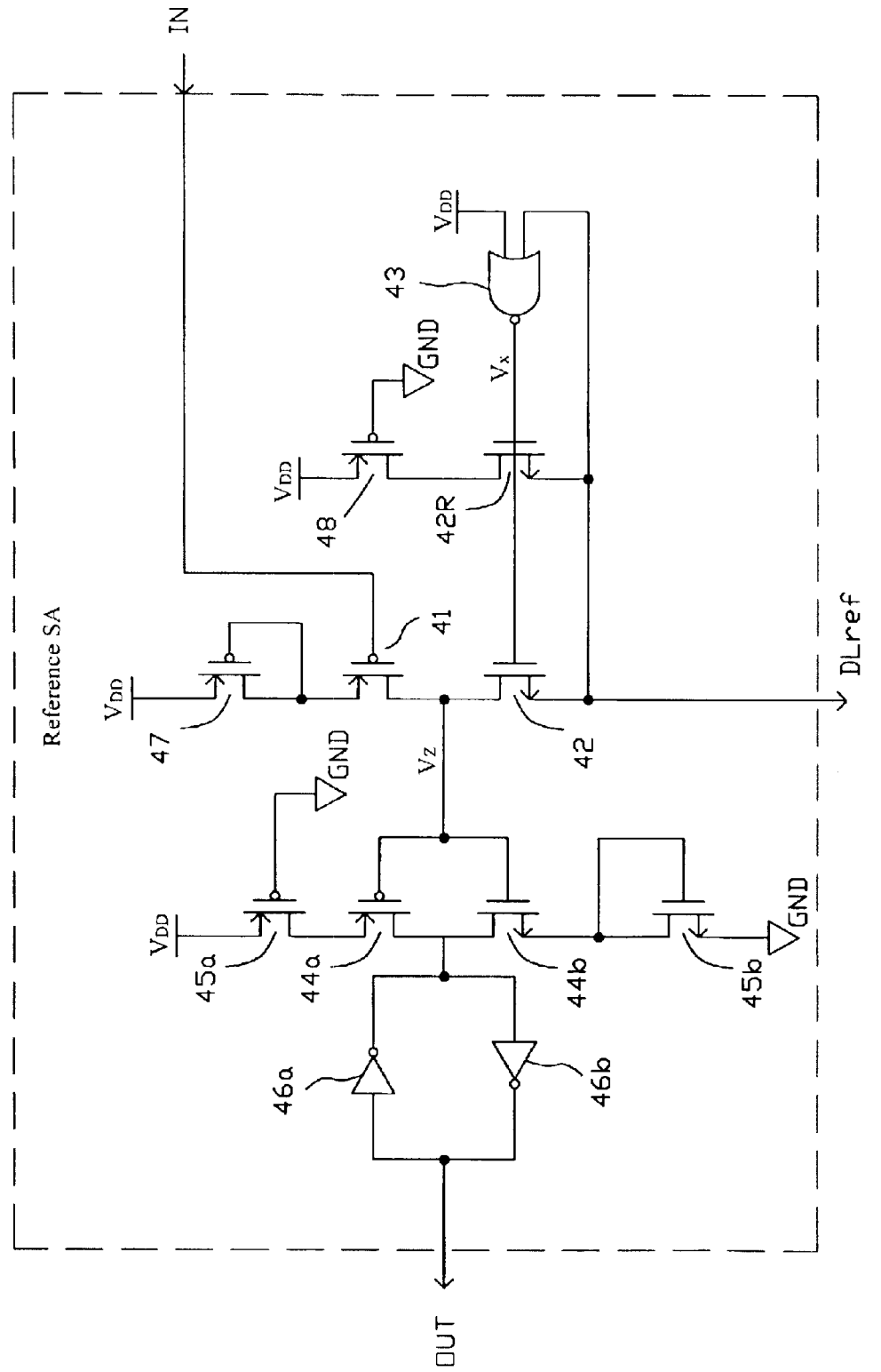
FIG. 3 is a prefered embodiment reference sense amplifier according to the present invention.

To achieve well tracking, the reference sensing delay 27 should be as close as possible to the sensing delay of the actual circuit, and FIG. 3 provides an improved sense amplifier 40 for this purpose. In the sense amplifier 40, the precharge path and sense path are separated. Particularly, the sense path is built up from the supply voltage VDD through MOS 47, 41 and 42 to the reference data line Dlref, and the precharge path is built up from the supply voltage VDD through MOS 48 and 42R to the reference data line Dlref. The reference data line DLref is connected to the mini-array for memory cell current simulation. The NMOS 42 acts as a transmission transistor, and is common-gated with the MOS 42R by a bias voltage Vx from the output of a NOR gate 43. The precharge signal PCB is for the input IN of the sense amplifier 40, and is applied on the gate of a PMOS 41. The voltage on the sense node Vz passes through an inverter circuit composed of MOSes 44a, 44b, 45a and 45b and a latch circuit composed of inverters 46a and 46b to produce the output OUT. In the sense path, the PMOS 47 is connected as a diode to reduce the voltage swing of the sense node Vz and the sense time, without disturbing the precharge mechanism for the reference data line DLref, and the size of the NMOS 42 is increased in the safe range to improve the sense speed. Alternatively, the PMOS 47 as a diode could be replaced with an NMOS or a depletion NMOS. Furthermore, the precharge current could be adjusted by changing the size of the NMOSes 48 and 42R for the reference data line DLref to be well controlled, without reducing the sense speed. The reference sensing delay produced by this sense amplifier 40 could be also adjusted by changing the size of the NMOSes 42 and 42R.

Figure 4:
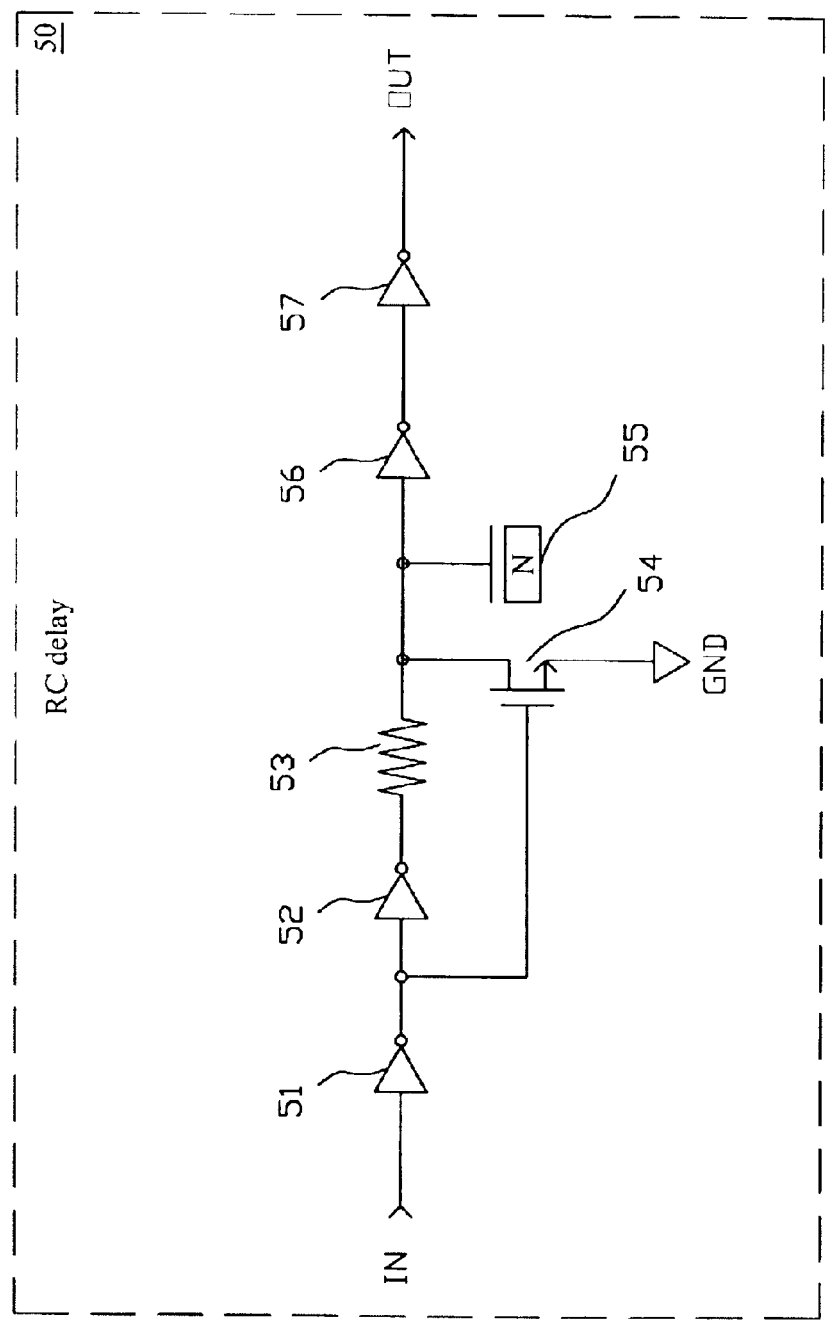
FIG. 4 shows a typical RC delay circuit.

Any commercial or conventional RC delay circuit can be employed for the RC delay shown in FIG. 2, and FIG. 4 shows an example. The RC delay 50 of FIG. 4 includes a series of inverters 51 and 52, resistor 53 and inverters 56 and 57 between its input IN and output OUT, a MOS 54 arranged between the input of the inverter 56 and the reference voltage or ground with its gate connected to the input of the inverter 52, and an NMOS capacitor 55 connected to the input of the inverter 56.

Figure 5:
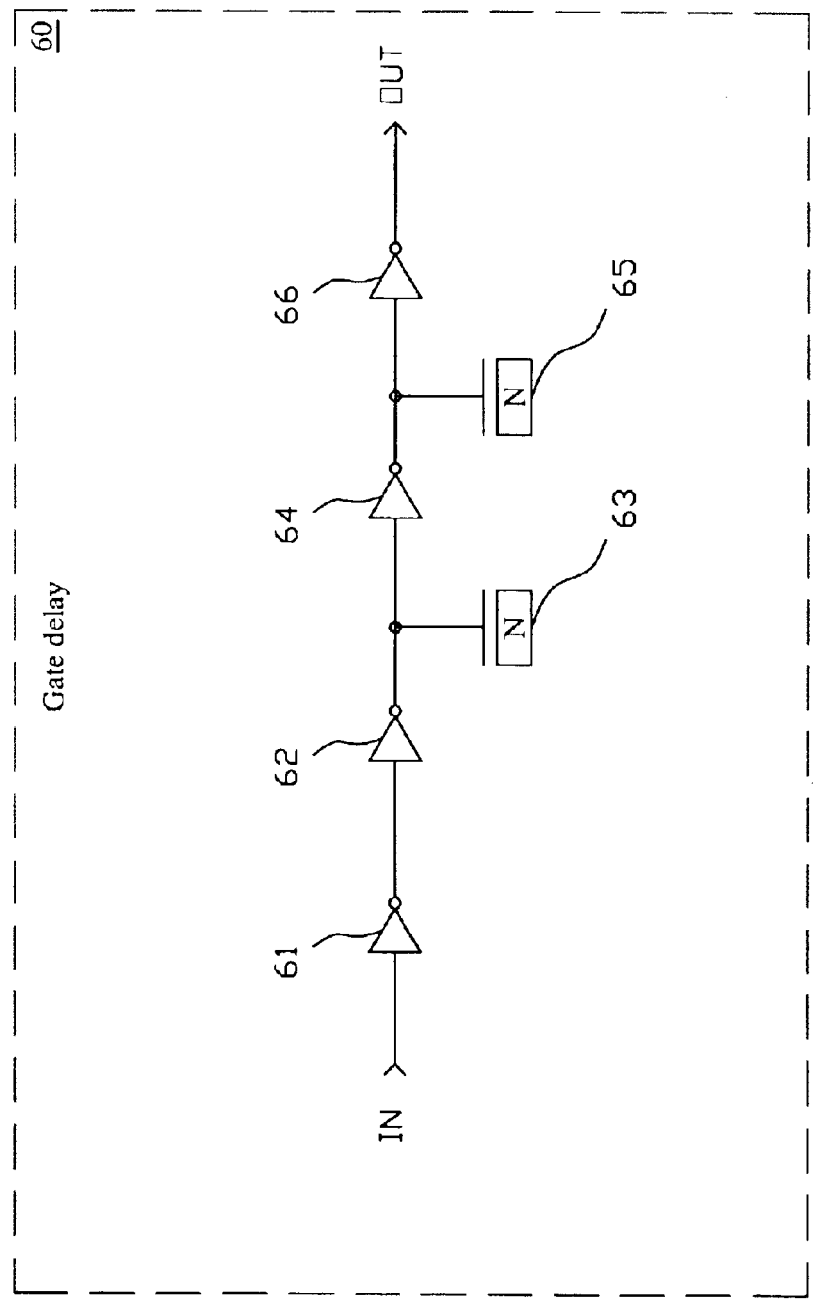
FIG. 5 shows a typical gate delay circuit.

Likewise, any commercial or conventional gate delay circuit can be employed for the gate delay shown in FIG. 2, and FIG. 5 shows an example. The gate delay 60 of FIG. 5 includes a series of inverters 61, 62, 64 and 66 between its input IN and output OUT. The input and the output of the inverter 64 are connected with NMOS capacitors 63 and 65, respectively.

Figure 6:
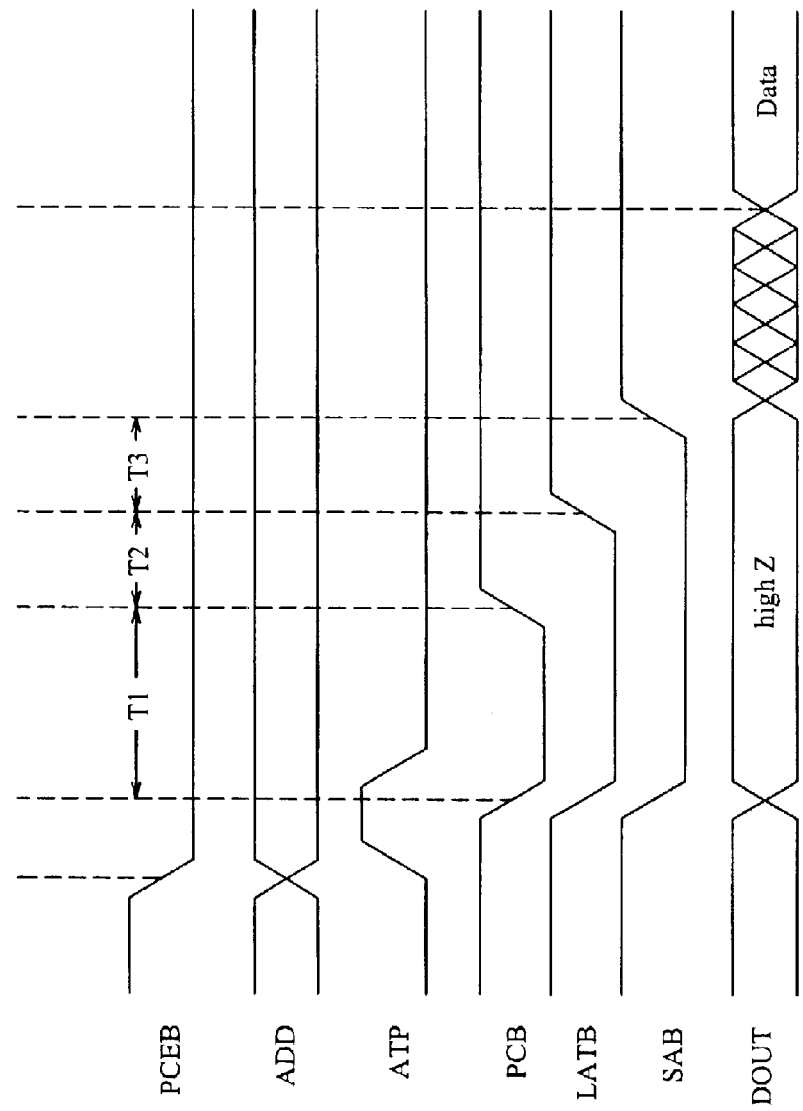
FIG. 6 shows a timing diagram of the control signals according to the present invention.

FIG. 6 is a timing diagram to illustrate the relationship among the control signals produced by the forgoing circuits. The address transition pulse signal ATP is first produced in response to chip enable signal PCEB and address signal ADD, and as mentioned in the above description, all the other control signals are produced according to the address transition pulse signal ATP. During period T1, the precharge signal PCB, latch signal LATB and sense amplifier enable signal SAB are produced, and due to the delays, the widths of the latch signal LATB and sense amplifier enable signal SAB are larger than that of the precharge signal PCB. During this period, the voltage of the sense node Vz will be pulled up to the level lower than the supply voltage VDD by a diode conductive voltage, for the diode 47 is inserted between the supply voltage VDD and PMOS 41, and this period can be as the precharge period. Then, during period T2, the precharge signal PCB raises, and at this moment the voltage of the sense node Vz is changeable that will be sustained at high level or descended to a predetermined level depending on the data to be read out. Hence, this period could be as the sense period. During period T3, the latch signal LATB raises, and then the data is latched by the latch of the sense amplifier 40. But the sense amplifier enable signal SAB raises a bit later than the latch signal LATB for the data to be latched properly. After period T3, the sense amplifier 40 could be turned off to decrease power consumption, and the output driver is turned on such that the correct data appear on the output bus, as designated by the data output DOUT in FIG. 6.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A sense amplifier comprising:

a reference data line coupled to a mini-array for cell current simulation;

a sense path coupled between a first supply voltage and the reference data line through one side of a transmission transistor having an other side connected to a sense node that is further connected to the sense path through an input transistor having a gate connected with an input signal;

a precharge path coupled between a second supply voltage and the reference data line through a transistor common-gated with the transmission transistor; and a latch coupled with the sense node for producing an output signal in response to the input signal.

2. A sense amplifier according to claim 1, further comprising a bias coupled to the transmission transistor and common-gated transistor.

3. A sense amplifier according to claim 1, wherein the sense path further comprises a diode inserted between the first supply voltage and input transistor.

4. A sense amplifier according to claim 3, wherein the diode is selected from the group composed of PMOS, NMOS and depletion NMOS.

5. A sense amplifier according to claim 1, wherein the transmission transistor and common-gated transistor have a size ratio to determine a sensing delay time.

* * * * *